United States Patent [19]
Ishiwata et al.

[11] Patent Number: 5,585,753
[45] Date of Patent: Dec. 17, 1996

[54] SAWTOOTH GENERATOR AND SIGNAL INTERPOLATING APPARATUS USING THE SAME

[75] Inventors: Muneo Ishiwata, Minamiashigara; Hiroaki Endoh, Isehara, both of Japan

[73] Assignee: Anritsu Corporation, Tokyo, Japan

[21] Appl. No.: 467,756

[22] Filed: Jun. 6, 1995

[30] Foreign Application Priority Data

Jun. 16, 1994 [JP] Japan .................................. 6-157917

[51] Int. Cl.$^6$ ................. H03K 4/08; H03K 4/90
[52] U.S. Cl. .................. 327/133; 327/131; 327/140; 327/360
[58] Field of Search .................. 327/131, 133, 327/134, 136, 99, 122, 360, 361, 407, 140, 355

[56] References Cited

U.S. PATENT DOCUMENTS

| | | | |
|---|---|---|---|
| 3,590,231 | 6/1971 | Wenzl | 235/197 |
| 3,654,479 | 4/1972 | Catherin | 327/260 |
| 4,295,189 | 10/1981 | Boys | 327/131 |
| 4,422,044 | 12/1983 | Mueller | 327/134 |
| 5,041,829 | 8/1991 | Garrett | 341/13 |
| 5,079,511 | 1/1992 | Donat | 327/360 |

FOREIGN PATENT DOCUMENTS

| | | | |
|---|---|---|---|
| 0230287 | 7/1987 | European Pat. Off. | H03M 1/24 |
| 2551936 | 3/1985 | France | H03K 4/08 |
| 1474140 | 3/1969 | Germany . | |
| 4-290312 | 10/1992 | Japan | H03M 1/24 |

OTHER PUBLICATIONS

Interpolating of Measurement Signals; pp. 8–9; "The Complete Catalog of Heidenhain Co., Ltd. of Japan"; Nov. 1992.

Primary Examiner—Timothy P. Callahan
Assistant Examiner—Terry L. Englund
Attorney, Agent, or Firm—Frishauf, Holtz, Goodman, Langer & Chick

[57] ABSTRACT

A sawtooth generates a sawtooth wave having a high response speed and good linearity with a simple arrangement in converting a change in phase of an input signal into a linear level change. A signal interpolating apparatus uses this sawtooth wave to output a predetermined signal (interpolation signal) every predetermined phase change of the input signal with a simple arrangement. An arithmetic operation section receives two sinusoidal signals A and B having equal periods and phases which are offset by 90° and with respect to each other, obtain a signal X=A/(B+a) and a signal Y=A/(B+B) using constants α and β respectively satisfying B+α≈0 and B+β≈0. A switching unit selects the linear ramp portions of the signals X and Y to output a continuous sawtooth wave. On the basis of the value of this sawtooth wave, a desired interpolation signal is output from a memory which stores predetermined data.

8 Claims, 7 Drawing Sheets

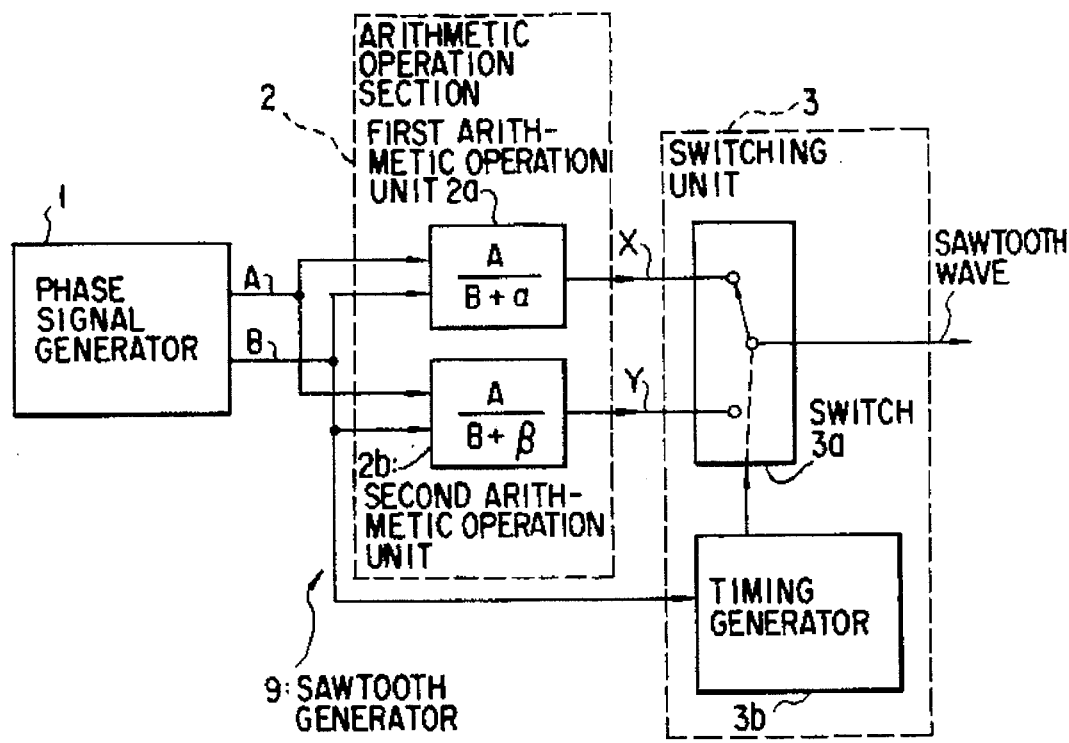
F I G. 1
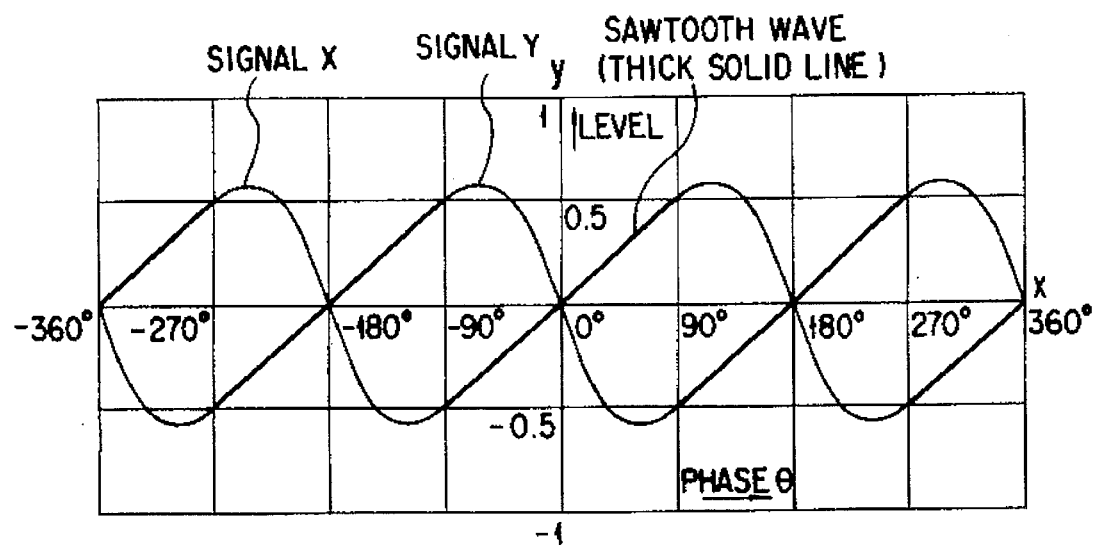
F I G. 2

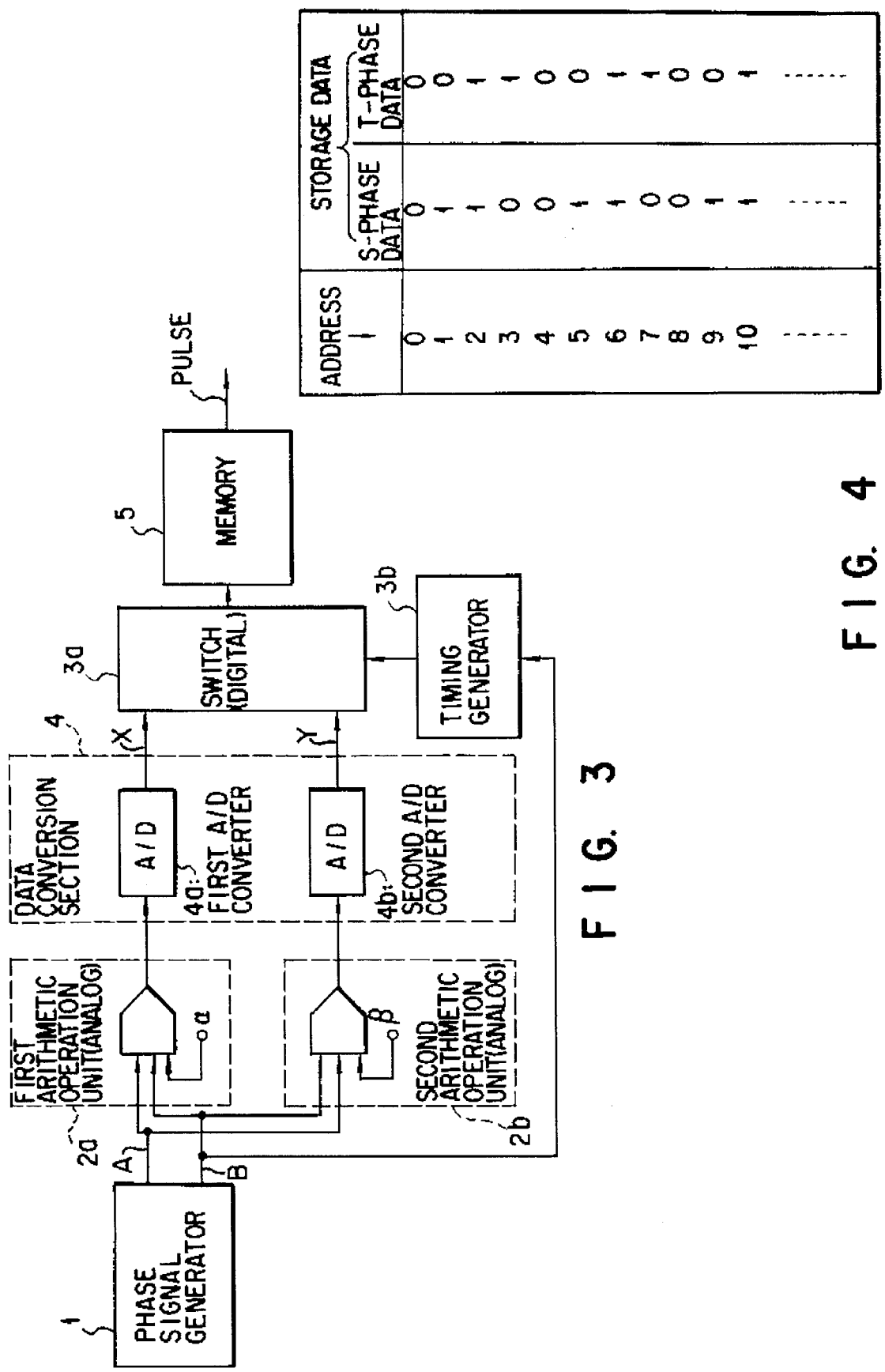

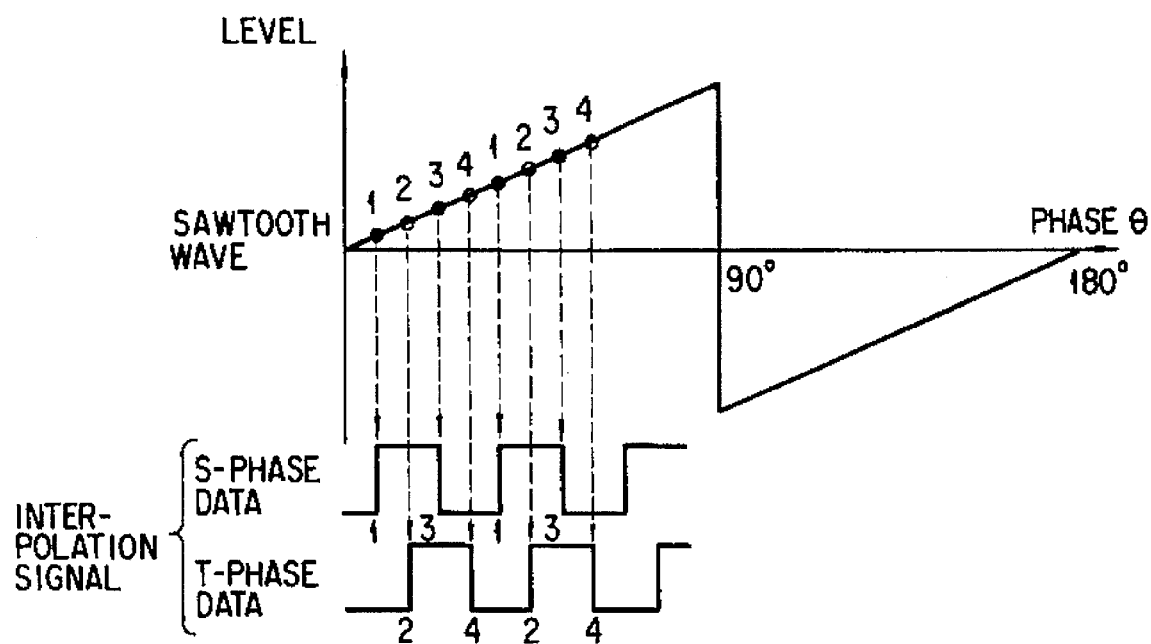
F I G. 5
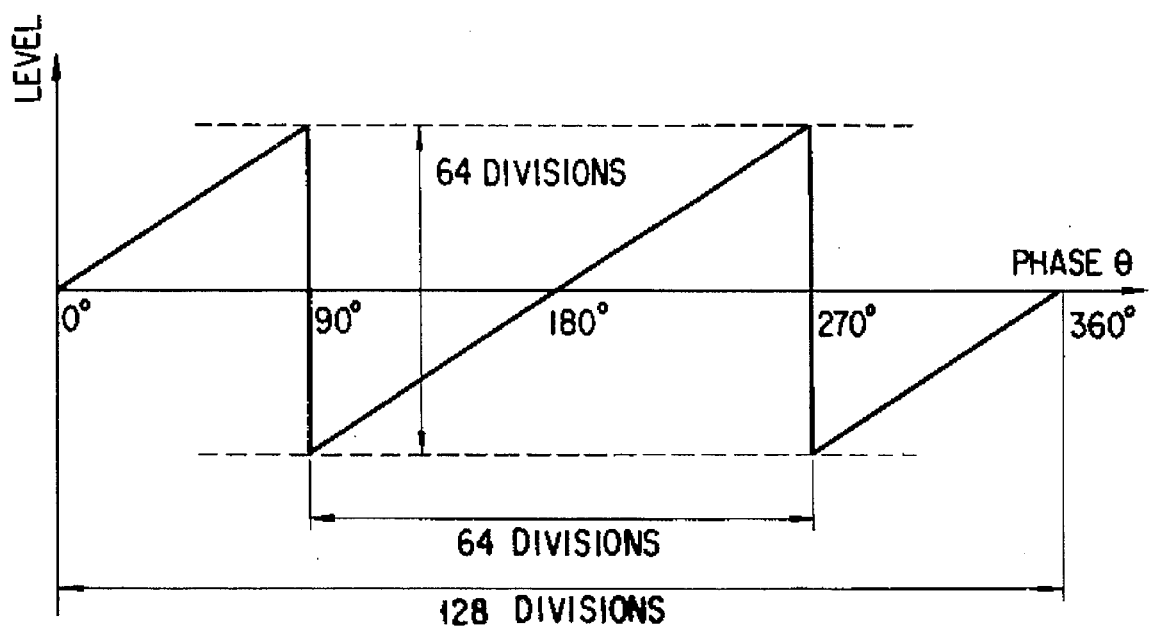
F I G. 6

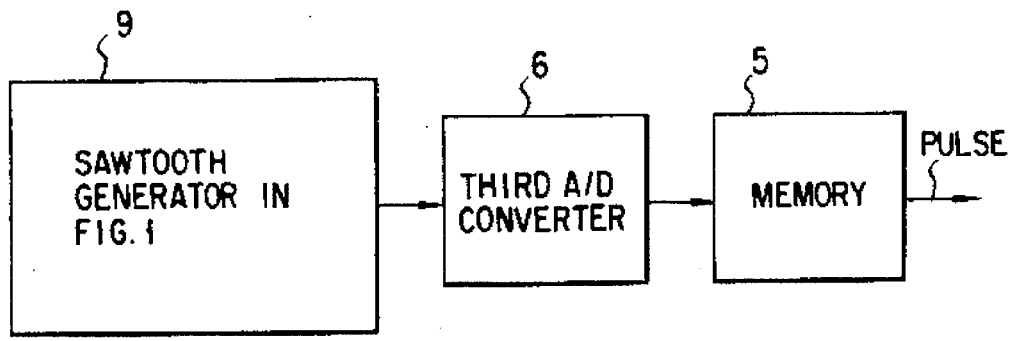
F I G. 7
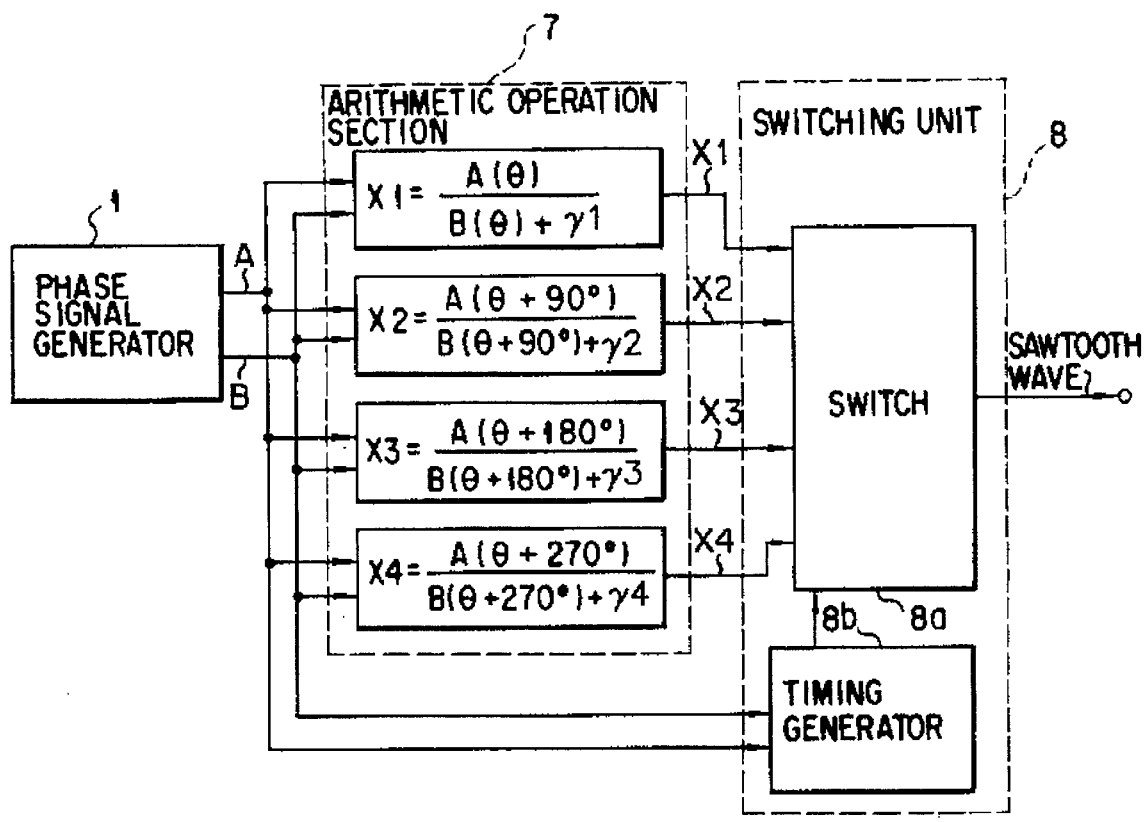
F I G. 8

SAWTOOTH GENERATOR AND SIGNAL INTERPOLATING APPARATUS USING THE SAME

BACKGROUND OF THE INVENTION

1. Field of the Invention

The present invention generally relates to a sawtooth generator and a signal interpolating apparatus using the same and, more particularly, to a sawtooth generator for generating a sawtooth wave whose amplitude linearly changes in correspondence with a phase change of an input signal having phase information and a signal interpolating apparatus using this sawtooth generator to generate an interpolation signal which repeats the same pattern once for each predetermined change in phase of the input signal.

2. Description of the Related Art

In using an input signal upon specifying a phase position thereof, e.g., in transmission of the input signal through mechanical rotation to set operating conditions such as the frequency and level of an electronic or optical device, it is often convenient to process data upon converting a phase change into a linear level change on the basis of two sinusoidal signals $A(\theta)$ and $B(\theta)$ changing with their phases $\theta$ representing rotational positions being shifted by 90°, as compared with direct processing of the phase information. A strong demand has arisen for a simple, high-speed apparatus for finely setting the operating conditions of such an electronic device.

In particular, the present invention relates to a sawtooth generator and a signal interpolating apparatus, which give considerations to the response speed, linearity, and apparatus size in converting a phase into a level to realize the above applications.

Generation of a sawtooth wave or interpolation signal upon reception of two sinusoidal signals $A(\theta)$ and $B(\theta)$ whose phases $\theta$ are shifted by 90° is conventionally performed by an apparatus called an encoder for converting, e.g., mechanical rotation into an electrical signal as phase information and outputting the phase information. The following conventional encoders are available.

(1) Sawtooth Generator and Signal Interpolating Apparatus of Arc Tangent Scheme

According to this scheme, the values (arc tangent values) of the phases $\theta$ of two sinusoidal signals $A=\sin\theta$ and $B=\cos\theta$ whose phases $\theta$ are shifted by 90° are obtained, and a sawtooth value is output using a ramp portion which approximately linearly changes. A pulse is generated at a position corresponding to the sawtooth value. As a result, a pulse train as a series of pulses is output. For example, a technique disclosed in Jpn. Pat. Appln. KOKAI Publication No. 4-290312 is available and generally described in FIG. 9. According to this technique, $\tan\theta$ and $\cot\theta$ are obtained from two sinusoidal signals $A=\sin\theta$ and $B=\cos\theta$ whose phases are shifted by 90°, and pulses are output. Note that no explicit description is made for the process of outputting the pulses from $\tan\theta$ and $\cot\theta$, but the $\theta$ values of the linear portion within the non-divergent range of $\tan\theta$ and $\cot\theta$ are used.

More specifically, referring to FIG. 9, a pair of first and second detectors 11a and 11b are arranged near the positions of a code plate 10 having codes 10a constituted by slits or the like. A $\sin N\theta$ signal as an A-phase analog signal obtained from the first detector 11a is input to a first A/D converter 13a through a first amplifier 12a.

A $\cos N\theta$ signal as a B-phase analog signal obtained from the second detector 11b is input to a second A/D converter 13b through a second amplifier 12b. The first and second digital signals obtained from the A/D converters 13a and 13b are input to a divider 14.

The $\sin N\theta$ and $\cos N\theta$ signals are divided by the divider 14 as follows.

That is, divisions $\cos N\theta/\sin N\theta=\cot N\theta$ and $\sin N\theta/\cos N\theta=\tan N\theta$ are calculated to obtain relative values A and B of the $\sin N\theta$ and $\cos N\theta$ signals.

The amplitude variations of the $\sin N\theta$ and $\cos N\theta$ signals in the above divisions are canceled as follows.

Assume that the amplitudes of the $\sin N\theta$ and $\text{Con}N\theta$ are defined as A and B, respectively, to give $A\sin N\theta$ and $B\cos N\theta$, and the amplitudes are adjusted to establish A=B.

Assuming that the drifts of $\sin N\theta$ and $\cos N\theta$ upon temperature changes and passage of time are defined as $\Delta V_A$ and $\Delta V_B$, respectively, $\Delta V_A \approx \Delta V_B$ is established. At this time, $\sin N\theta$ and $\cos N\theta$ become $(A+\Delta V_A)\sin N\theta$ and $(B+\Delta V_B)\cos N\theta$. Direct use of the A/D data of these signals causes an increase in error. For this reason, $\sin N\theta$ and $\cos N\theta$ are divided to obtain $(A+\Delta V_A)\sin N\theta/(B+\Delta V_B)\cos N\theta=\tan N\theta$ (because $A+\Delta V_A \approx B+\Delta V_B$). Therefore, the amplitude variations can be canceled.

The relative values $\tan N\theta$ and $\cot N\theta$ are two phase signals free from variations because the variations in ambient temperature, frequency, and the like are canceled. These relative values are extracted as an output signal through an up/down circuit 15 and a counter 16.

The prior art shown in FIG. 9 is related to a method of interpolating an encoder signal. More specifically, the $\sin N\theta$ and $\cos N\theta$ signals as analog signals are divided to calculate a relative value to obtain a high-precision digital signal free from the variations in ambient temperature or frequency. For this purpose, in the method of interpolating the encoder signal wherein $\sin N\theta$ and $\cos N\theta$ signals are extracted from N codes formed on the code plate to convert these signals into digital signals by A/D converters, the digital signals are divided to obtain the relative values of the $\sin N\theta$ and $\cos N\theta$ signals.

(2) Signal Interpolating Apparatus by Resistance Division Scheme

As shown in FIG. 10, a signal interpolating apparatus of this scheme sequentially obtains signals, whose phases are shifted by a predetermined value, from a sum of the vectors of two sinusoidal signals $A=\sin\theta$ and $B=\cos\theta$. The resultant signals are exclusively ORed to obtain an interpolation signal.

More specifically, FIG. 10 shows a technique associated with an interpolating-digital circuit for interpolating a measurement signal, as described on pages 8, 9 in the complete catalog of HEIDENHAIN Co., Ltd. of Japan.

In this interpolating-digital circuit, scanning signals $I_{e1}$ and $I_{e2}$ shown in FIG. 11A are amplified and then interpolated. As shown in FIG. 11B, a resistance circuit (R) for additionally generating a phase difference signal upon addition of the vectors of the two sinusoidal signals is used in this signal interpolation. FIG. 10 shows the details of this circuit and the phases of five times interpolation.

In the illustrated example, a part of 10 signals having phases from 0° to 162° is shown. These signals are converted into rectangular signals and combined into two rectangular pulse trains by two exclusive OR (XOR) gates. As shown in FIG. 11C, the frequencies of output signals $U_{a1}$ and $U_{a2}$ are higher than those of the input signals by five times and phase-shifted by ¼ the period of the signal having a higher frequency of the two. A reference mark signal $U_{a0}$ is gated between two continuous edges of the output signals $U_{a1}$ and $U_{a2}$.

The four signal edges of $U_{a1}$ and $U_{a2}$ are used as count pulses during one signal period.

The distance between the two output signals $U_{a1}$ and $U_{a2}$ is one measurement pitch which is 1/20 the scale graduation interval.

(3) Signal Interpolating Apparatus by Interpolation Table Scheme

As shown in FIG. 12, this scheme is a method in which two sinusoidal signals A=sinθ and B=cosθ are converted into digital data, and the angular position of an encoder which corresponds to the digital data is obtained from an interpolation table (memory) prepared using the digital data in advance, thereby generating a pulse using this position.

That is, the scheme in FIG. 12 is a technique also described in the above complete catalog.

In this case, two original signals $I_{e1}$ and $I_{e2}$ from, e.g., light-receiving elements are amplified and converted into analog voltages. These voltages are held in sample/hold circuits (S/Hs) and converted into digital signals by A/D converters at regular intervals (clocks).

The instantaneous position values within one signal period are generated in the interpolation table (IT) using these two digital voltage values. The tracking circuit TC compares each instantaneous position value with the value obtained in the previous cycle. The tracking counter TC generates 0° and 90° signals from the difference of these two position values.

Incremental rectangular signals $U_{a1}$ and $U_{a2}$ appear from the output stage of the tracking circuit TC.

The following drawbacks are found in the above three conventional techniques.

(1) Sawtooth Generator and Signal Interpolating Apparatus of Arc Tangent Scheme

According to this scheme, the arc tangent values include divergent components depending on the values of the phases θ, so that the approximately linear portion is narrow when the approximately linear portion is to cover a phase θ range of 360°, the arithmetic volume is very large. For this reason, the measurement values are generally converted into digital values by A/D converters, and the arithmetic operation of these digital values is performed by a CPU. The response speed of an output upon a change in phase θ thus depends on the CPU. The technique described in Jpn. Pat. Appln. KOKAI Publication No. 4-290312 is also assumed to be dependent on a CPU. To increase the arithmetic speed by a CPU, a high-speed CPU must be used. In addition to such a CPU, a program, a ROM, and a RAM are required.

(2) Signal Interpolating Apparatus by Resistance Division Scheme

According to this scheme, the degree of interpolation is limited to 20 repetitions of the output signal for a single repeated value of the phase θ.

(3) Signal Interpolating Apparatus by Interpolation Table Scheme

According to this scheme, since data are directly read out from the interpolation table (memory) using the digital data obtained by converting two sinusoidal signals A=sinθ and B=cosθ, poor linearity of the converted digital data is directly reflected on the final results. Although linearity may be compensated on the interpolation table side, the interpolation table is overloaded, and interpolatable linearity has limits.

SUMMARY OF THE INVENTION

It is, therefore, an object of the present invention to provide a new and improved sawtooth generator and a signal interpolating apparatus using the same which can particularly increase the response speed and reduce the apparatus size in consideration of the response speed, linearity, degree of interpolation, and apparatus size.

In order to achieve the above object, the following means are employed.

① Means for Generating Sawtooth wave Whose Level Linearly Increases or Decreases Over Wide Phase Range When two sinusoidal signals are defined as A=sinθ and B=cosθ, and a positive constant a1 which satisfies B±α1≈0 is selected to be an appropriate value, · a signal X=A/(B+α1) provides a sawtooth wave whose level linearly changes while the phase θ changes at least 180° (a sinusoidal wave is linearized), · when a signal Y=A/(B−α1) is also prepared, this sinusoidal signal can be linearized for another 180°-rotation interval, so that a sawtooth wave can be obtained while the phase θ changes 360°, and · at least two of these signals X and Y can be arithmetically obtained in the above arithmetic operations because these operations can be performed by high-speed analog arithmetic operations as well as high-speed CPU operations. Arithmetic processing having a small volume, capable of achieving a high-speed response, and capable of achieving downsizing can be realized on the assumption that good linearity is obtained over a wide range (0° to 360°).

② Signal Interpolating Apparatus

Data of predetermined patterns are prestored in a memory in an address order, and an address of the memory is accessed by a sawtooth level output from the means for generating the sawtooth wave in ①, thereby providing a single signal interpolating apparatus capable of outputting an interpolation signal for finely specifying the phase θ.

The practical arrangements are as follows.

(A) Arrangement of claim 1

An arithmetic operation section receives two sinusoidal signals A and B having equal periods and phases which are offset by 90° with respect to each other, and performs first and second arithmetic operations respectively using a signal X=A/(B+α) (where α is a constant satisfying B+α≈0) and a signal Y=A/(B+B) (where β is a constant satisfying B+β≈0). A switching unit alternately selects linear ramp portions of the signals X and Y to output a sawtooth wave. As a typical example, if A=sinθ, B=cosθ (or A and B may be reversed), α>1, and β=−α, then the signals X and Y have approximately linear ramp portions every phase 8 interval of 180°. The switching unit switches the ramp portions for every zero-crossing of the sinusoidal signal B, thereby outputting a sawtooth wave.

(B) Arrangement of claim 3

To increase the response speed, the arithmetic operation section performs analog arithmetic operations. In addition, a first arithmetic operation unit for performing the first arithmetic operation is connected in parallel with a second arithmetic operation unit for performing the second arithmetic operation. First and second A/D converters are arranged to convert the outputs from the first and second arithmetic operation units into digital signals. A digital switching unit for switching the digital X and Y signals at a high speed is also arranged.

A memory which prestores data of predetermined patterns in an address order receives the sawtooth digital signals as address values to output a predetermined pattern signal. As a typical example of the memory, data representing four state values (minimum data is a two-bit combination of "0" and "1") are stored so as to repeat in the address order, so that the values of sawtooth ramp portions which linearly change are read out to output two pulse trains having different phases.

In this case, "0" and "1" are repeatedly read out from the memory to obtain pulses which divide the range of the phase θ of 360° by 128.

(C) Arrangement of claim 5

As in the arrangement of claim 3, the arithmetic operation section comprises first and second analog arithmetic operation elements which are connected in parallel with each other. After a switching unit switches the analog outputs from the first and second arithmetic operation units, a sawtooth wave expressed in the form of a digital value is output from an A/D converter. The remaining operation of the arrangement of claim 5 is the same as that of claim 3. The arrangement of claim 5 has a lower response speed than that of claim 3, but requires only one A/D converter.

(D) Arrangement of claim 7

This arrangement has better linearity than that of the above arrangements. For this purpose, the arithmetic operation section divides a phase θ range of 360° into four phase intervals, i.e., 90°-phase intervals, and output signals X1, X2, X3, and X4 which represent linear portions in these four phase intervals. The signals X1, X2, and X3, and X4 have such a relationship that each signal is shifted from an adjacent signal by 90°.

Upon reception of the two sinusoidal signals A(θ) and B(θ), the signals X1, X2, X3, and X4 are represented as follows:

Signal $X1=A(θ)/\{(B(θ)+γ1\}$,

Signal $X2=A(θ+90°)/\{(B(θ+90°)+γ2\}$,

Signal $X3=A(θ+180°)/\{(B(θ+180°)+γ3\}$, and

Signal $X4=A(θ+270°)/\{(B(θ+270°)+γ4\}$ (where $γ1, γ2, γ3$, and $γ4$ are constants respectively satisfying $B(θ)+γ1≈0$, $B(θ+90°)+γ2≈0$, $B(θ+180°)+γ3≈0$, and $B(θ+270°)+γ4≈0$).

The switching unit sequentially and alternately switches the signals X1, X2, X3, and x4 output from the arithmetic operation unit to output a continuous sawtooth wave.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram showing the arrangement of a sawtooth generator according to the first embodiment of the present invention;

FIG. 2 is a chart showing main signal waveforms of the first embodiment;

FIG. 3 is a block diagram showing the arrangement of a signal interpolating apparatus according to the second embodiment of the present invention;

FIG. 4 is a table showing storage data of a memory;

FIG. 5 is a view showing the waveforms of an interpolation signal;

FIG. 6 is a view for explaining generation of an interpolation signal upon dividing a sawtooth wave;

FIG. 7 is a block diagram showing the arrangement of a signal interpolating apparatus according to the third embodiment of the present invention;

FIG. 8 is a block diagram showing the arrangement of a signal interpolating apparatus according to the fourth embodiment of the present invention;

DETAILED DESCRIPTION OF THE PREFERRED EMBODIMENTS

Figures 9, 10:
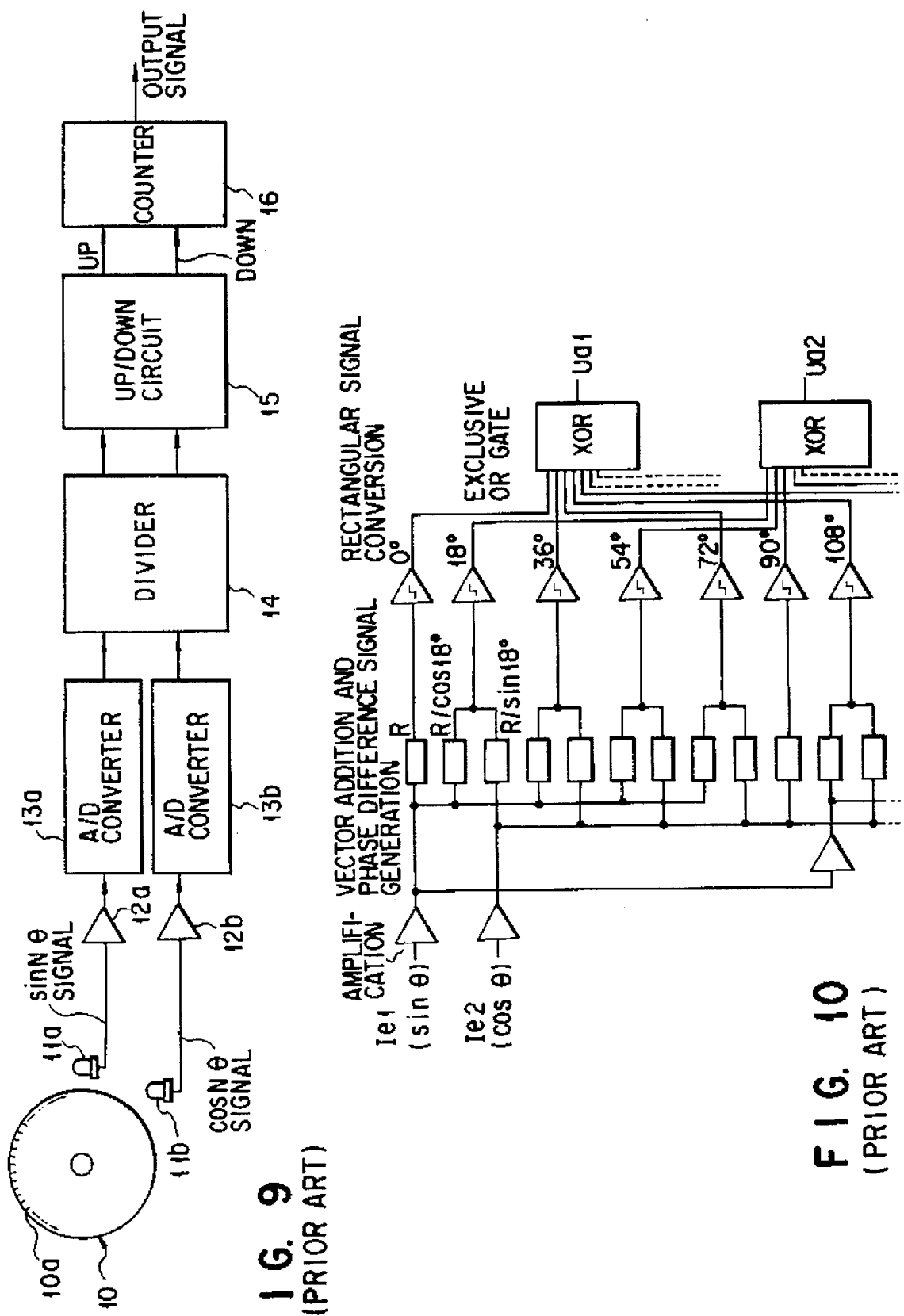
FIG. 9 is a block diagram showing the arrangement of a signal interpolating apparatus of a conventional arc tangent scheme.
FIG. 10 is a block diagram showing the arrangement of a signal interpolating apparatus of a conventional resistance division scheme.
Figure 11A:
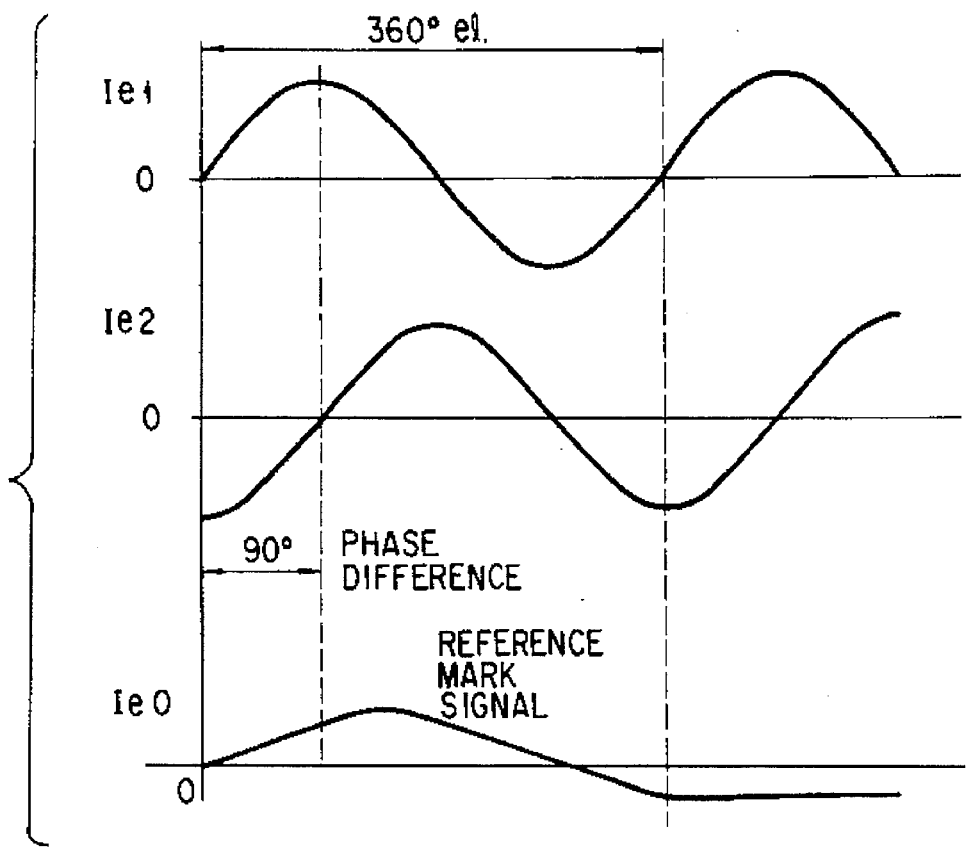
FIGS. 11A, 11B, and 11C are charts for explaining the operation of the conventional resistance division scheme.
Figure 11B:
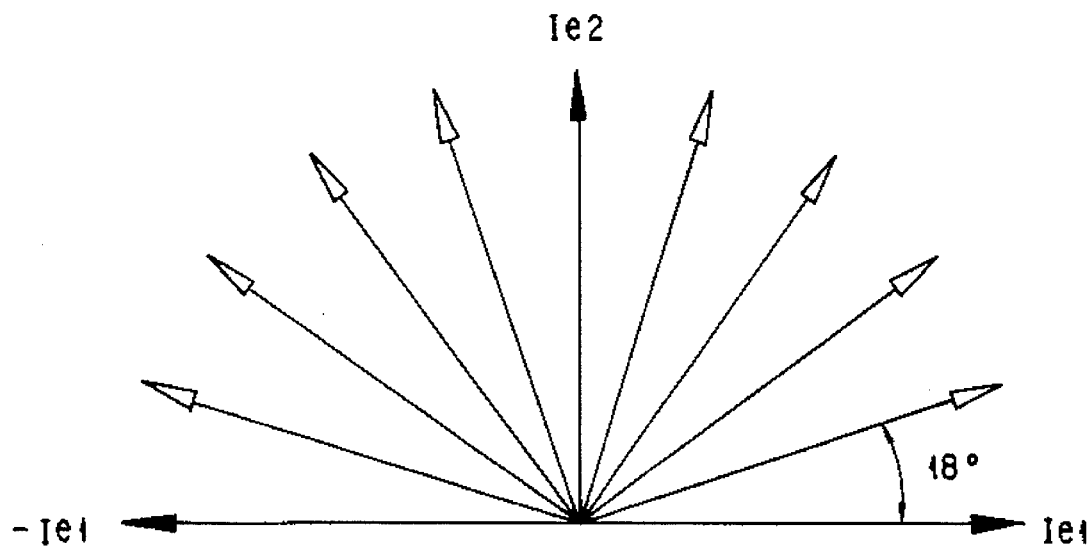
Figure 11C:
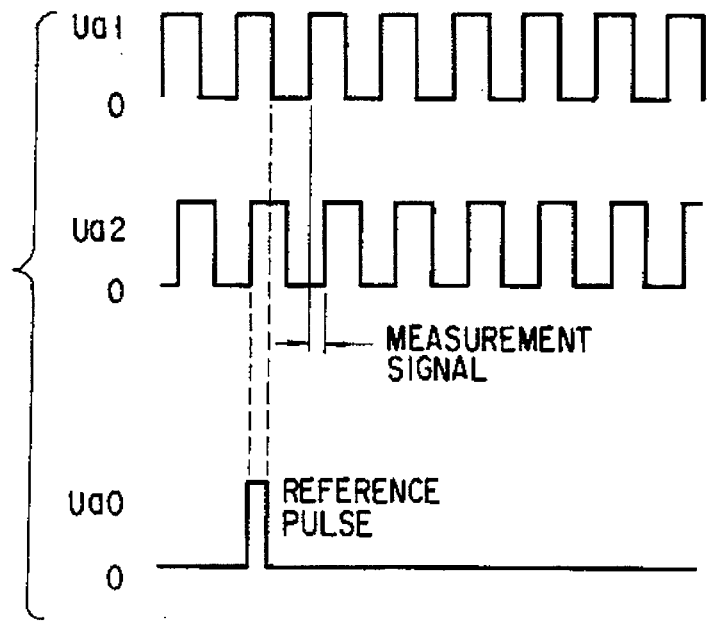
Figure 12:
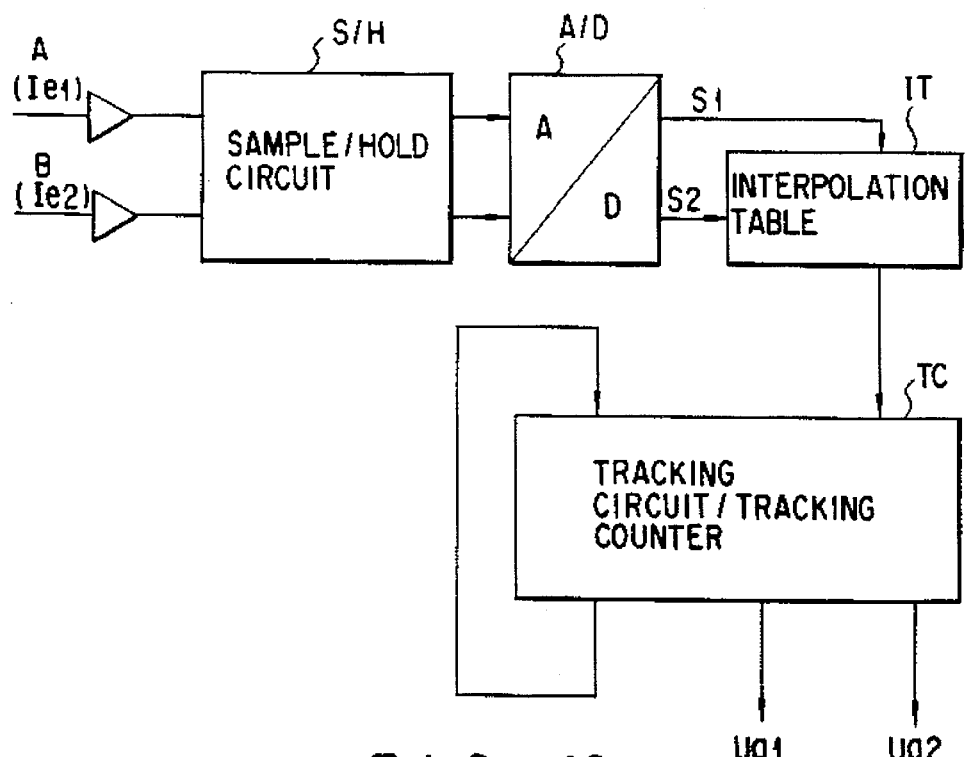
FIG. 12 is a block diagram showing the arrangement of a signal interpolating apparatus of a conventional interpolation table scheme.

Reference will now be made in detail to the presently preferred embodiments of the invention as illustrated in the accompanying drawings, in which like reference characters designate like or corresponding parts throughout the several drawings.

1. Embodiment of claim 1 (to be referred to as the first embodiment hereinafter)

FIG. 1 is a block diagram showing an arrangement according to the first embodiment.

Referring to FIG. 1, a phase signal generator 1 outputs two sinusoidal signals A and B having equal periods and phases which are offset by 90° with respect to each other. The phase signal generator 1 comprises, e.g., a device driven manually or by a motor to output a mechanical rotation position as phase information as in an encoder described in Jpn. Pat. Appln. KOKAI Publication No. 4-290312. The sinusoidal signals A and B are defined as $A=a\sinθ$ and $B=b\cosθ$ (a and b have the same sign). For the descriptive convenience, $a=b=1$ is given in the following description (specific values except for $a≈1$ and $b≈1$ are also valid in the present invention).

An arithmetic operation section 2 receives the sinusoidal signals $A=\sinθ$ and $B=\cosθ$ and outputs signals X and Y whose phases are shifted by 180° by the following operations:

Signal $X=A/(B+α)$ (where α is a constant satisfying $B+α≈0$), and

Signal $Y=A/(B+D)$ (where D is a constant satisfying $B+β≈0$).

The constants α and β are selected to satisfy $α>1$ and $D<-1$ under the condition $a=b=1$, and to make the signals X and Y alternately have ramp portions of approximated straight lines, respectively, in the ranges of 180° every phase θ interval of about 180°, as shown in FIG. 2. Note that FIG. 2 shows all possible values of the signals X and Y for $β=-α$. The phase θ is plotted along the abscissa of FIG. 2, and the normalized magnitude is plotted along its ordinate.

The absolute values $|α|$ and $|β|$ of the constants and β are almost equal to total amplitude widths $|2A|$ and $|2B|$ of the sinusoidal waves. That is, if $a=b=1$, then each of the appropriate values of $|α|$ and $|β|$ is about 2.

The arithmetic operation section 2 may be constituted by an analog arithmetic operation section depending on the types of input sinusoidal signals A and B. Alternatively, the arithmetic operation section 2 may perform digital arithmetic operations. A phase interval of 360° can be covered by approximated straight lines in accordance with two arithmetic operations free from divergence of the signals X and Y. Even if the arithmetic operations are performed by the CPU, the CPU load can be reduced as compared with the prior art. In this case, prior to the arithmetic operations, the sinusoidal signals $A=\sin\theta$ and $B=\cos\theta$ must be converted into digital data. Unlike in conversion of a straight line, the resolution of the A/D converter is very important.

A switching unit 3 connects the ramp portions of the approximated straight lines of the signals X and Y to output a continuous sawtooth wave. The waveform of this sawtooth wave is represented by thick solid lines in FIG. 2. In the arrangement of FIG. 1, a first arithmetic operation unit 2a and second arithmetic operation unit 2b in the arithmetic operation section 2 are parallelly operated to calculate the signals X and Y. The switching unit 3 switches the outputs from the arithmetic operation units 2a and 2b every phase $\theta$ interval of about 180°. However, the outputs from the first and second arithmetic operation units 2a and 2b may be coupled to a buffer (not shown) or the like to switch the input sides of the arithmetic operation units 2a and 2b. Alternatively, the switching unit 3 may control the first and second arithmetic operation units 2a and 2b to operate them serially, or one arithmetic operation unit may alternately calculate the signals X and Y depending on the arrangement of the arithmetic operation section 2.

When the two arithmetic operation units 2a and 2b of the arithmetic operation section 2 are operated parallelly to select the outputs therefrom, as shown in FIG. 1, the switching unit 3 comprises a timing generator 3b and a switch 3a. The timing generator 3b detects each zero-crossing point of, e.g., the sinusoidal signal B to output a timing switching signal required for selecting the ramp portions of the signals X and Y. Upon reception of this switching signal, the switch 3a switches the outputs from the two arithmetic operation units 2a and 2b to output a continuous sawtooth wave.

Note that the switch 3a of the switching unit 3 may be an analog or digital switch depending on the types of the signals X and Y from the arithmetic operation section 2.

2. Embodiment of claim 3 (to be referred to as the second embodiment hereinafter)

The arrangement of the second embodiment is shown in FIG. 3.

The second embodiment exemplifies a signal interpolating apparatus using the sawtooth generator of the first embodiment to output an interpolation signal repeated every change in phase $\theta$ by a predetermined amount.

The same reference numerals as in the first embodiment denote the same parts in FIG. 3. In the second embodiment, first and second arithmetic operation units 2a and 2b comprise analog arithmetic operation units, respectively, and a switch 3a comprises a digital switch. In this case, the first and second arithmetic operation units 2a and 2b can calculate constants $\alpha$ and $\beta$ as analog voltage values, respectively.

Referring to FIG. 3, a data conversion section 4 comprises first and second A/D converters 4a and 4b. Output signals X and Y from the first and second arithmetic operation units 2a and 2b are converted into digital data X and Y and output from the first and second A/D converters 4a and 4b, respectively.

The switch 3a receives a switching signal from a timing generator 3b and the data X and Y, selects data corresponding to the linear ramp portions of the signals X and Y shown in FIG. 2, and outputs continuous sawtooth digital data.

A memory 5 prestores interpolation signal data which can be directly read out using the sawtooth digital data from the switch 3a.

For example, when two phase pulses are output as an interpolation signal, the memory 5 conveniently stores data of four state values having two phase pulse waveforms. FIG. 4 shows the data stored in the memory. As shown in FIG. 4, four state values are expressed by a minimum of two bits. As shown in FIG. 5, such data is directly read out using the sawtooth digital data, so that two phase pulse trains can be directly output. The rotational directions of the phases $\theta$ of the sinusoidal signals A and B from the phase signal generator 1 can also be detected using these two phase pulse trains. That is, referring to FIG. 4, if the "S-phase" data and "T-phase" data are "0" and "1", respectively, the phase $\theta$ is determined to be in normal rotation. However, if the "S-phase" and "T-phase" data are "1" and "0", respectively, the phase $\theta$ is determined to be in reverse rotation.

The second embodiment having the above arrangement has the following features.

① The two analog arithmetic operation units 2a and 2b are operated parallelly to obtain a response speed up to several kHz with a simpler arrangement than that of the arc tangent scheme using a CPU and a memory.

② The delay of a time (200 to 300 μs) required to stabilize an analog switch and its drive system can be reduced in use of the two A/D converters and the digital switch 3a.

③ Highly linear signals X and Y are obtained by the arithmetic operations of the two analog arithmetic operation units 2a and 2b and A/D-converted to reduce the load of the memory 5 (when A/D conversion is performed for portions having poor linearity as in use of the interpolation table of the prior art, corrected data must be stored on the memory side, thereby increasing the load).

Since A/D conversion is performed by arithmetic operations upon conversion into straight lines, the load of the A/D converters can be reduced, and an interpolation signal can have a higher resolution.

④ When the storage data of the memory 5 is arranged in two bits, two phase pulse trains having a high speed can be obtained with a simple arrangement.

Values of the main part of the second embodiment will be examined below. In this case, assume that a pulse train obtained by dividing one period of a sawtooth wave in FIG. 6 by 128 and its level by 64 is output.

As can also be apparent from FIG. 5, four data points are required for the first and second A/D converters 4a and 4b to generate one 250-kHz two-phase pulse. For this purpose, a clock of 1 MHz ($=250\times4$) is required as a sampling timing pulse.

The level resolution becomes $2^8$ ($=64\times4$), and at least a resolution of 8 bits is required.

In practice, a resolution of 12 bits must be prepared.

In order to sample data of 512 points ($=128\times4$) per rotation of the phases $\theta$ of the sinusoidal signals A and B in an A/D converter having a sampling rate of 1 MHz, a signal of 512 μs ($=512\times1$ μs) is processed.

The first and second arithmetic operation units 2a and 2b process a signal having a maximum frequency of about 2 kHz as the reciprocal of the signal of 512 μs. This order is law enough to allow an analog arithmetic unit to respond.

3. Embodiment of claim 5 (to be referred to as the third embodiment hereinafter)

An arrangement according to the third embodiment is shown in FIG. 7.

In the arrangement shown in FIG. 7, a third A/D converter 6 is connected to the output of a sawtooth generator 9 in FIG. 1, and a memory 5 of the second embodiment is connected to the output of the third A/D converter 6. Note that first and second arithmetic operation units 2a and 2b and a switch 3a in the sawtooth generator 9 perform analog operations, respectively.

The operation of the sawtooth generator 9 is the same as that of the first embodiment, and the operation of the signal interpolating apparatus including the third A/D converter 6 and the memory 5 is identical to that of the second embodiment, except that the input position of the A/D converter is different from that of the second embodiment, and the response speed is lower than that of the second embodiment because the analog switch 3a is used. In this case, however, only one A/D converter is required to simplify the arrangement.

4. Embodiment of claim 7 (to be referred to as the fourth embodiment hereinafter)

The arrangement of the fourth embodiment is shown in FIG. 8.

While the 360°-rotation range of the phases θ of the sinusoidal signals A and B is interpolated by two 180°-shifted arithmetic operations (signals X and Y) in the first embodiment, this range is interlated by four 90°-shifted arithmetic operations in the fourth embodiment. In the fourth embodiment, the apparatus size is sacrificed, and linearity is given the primary importance.

The same reference numerals as in the first embodiment denote the same parts in FIG. 8.

Referring to FIG. 8, an arithmetic operation unit 7 receives two sinusoidal signals A(θ) and B(θ) from a phase signal generator 1 and calculates and outputs the following signals X1, x2, X3, and X4:

Signal X1=A(θ)/{(B(θ)+γ1},
Signal X2=A(θ+90°)/{(B(θ+90° )+γ2},
Signal X3=A(θ+180°)/{(B(θ+180°)+γ3}, and
Signal X4=A(θ+270°)/{(B(θ+270°)+γ4}

(where γ1, γ2, γ3, and γ4 are constants which have the same functions as those of the constants α and β of the first embodiment and respectively satisfy B(θ)+γ1 ≈0, B(θ+90°)+γ2≈0, B(θ+180°)+γ3≈0, and B(θ+270°)+γ4≈0).

A switching unit 8 comprises a switch 8a and a timing generator 8b. The timing generator 8b receives the sinusoidal signals A and B, detects, e.g., the zero-crossing points of these signals, and outputs a switching signal for extracting the ramp portion of approximated straight line of each of the signals X1, x2, x3, and X4 every 90° rotation. Upon reception of this switching signal, the signals X1, X2, X3, and X4 are sequentially switched every phase θ interval of 90° to output a continuous sawtooth wave.

The conditions of other components are the same as those of the first embodiment. In the first embodiment, the signals X1 and X3 of the fourth embodiment, i.e., the adjacent signals having a phase difference of 180° are used.

a. Advantage of Claim 1

An arithmetic operation section receives two sinusoidal signals A and B changing with the phases being shifted by 90° and performs first and second arithmetic operations respectively using a signal X=A/(B+α) (where α is a constant satisfying B+α≈0) and a signal Y=A/(B+B) where 62 is a constant satisfying B+β≈0). When the constants α and β are selected to be appropriate values, respectively, a sawtooth wave whose level linearly changes can be obtained with a simple arrangement while the phase θ changes 360°. In addition, a high-speed response can be achieved even in analog arithmetic operations.

b. Advantage of Claim 3

The arithmetic operation section performs analog arithmetic operations. In addition, a first arithmetic operation unit for performing the first arithmetic operation is connected in parallel with a second arithmetic operation unit for performing the second arithmetic operation. First and second A/D converters are arranged to convert the outputs from the first and second arithmetic operation units into digital signals. The digital X and Y signals are switched at a high speed. An interpolation signal having a high resolution and an improved response speed, i.e., pulses divided by 128 within the phase θ range of 360° can be obtained with a simple arrangement.

In addition, the memory is directly accessed using digital data to directly output an interpolation signal. From this viewpoint, the arrangement can be simplified.

c. Advantage of Claim 5

As in the arrangement of claim 3, the arithmetic operation section comprises first and second analog arithmetic operation elements which are connected in parallel with each other. After a switching unit switches the analog outputs from the first and second arithmetic operation units, a sawtooth wave expressed in the form of a digital value is output from an A/D converter. Although the response speed is lower than that of the second embodiment, the apparatus size can be smaller than that of the second embodiment because only one A/D converter is used.

d. Advantage of claim 7

The arithmetic operation section divides a phase range θ of 360° into four phase intervals, i.e., 90°-phase portions, and output signals x1, X2, X3, and X4 which represent linear portions in these four phase intervals. Therefore, linearity can be further improved.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A sawtooth generator comprising:

first arithmetic operation means for receiving a first sinusoidal signal A (=sin θ) and a second sinusoidal signal B (=cos θ, ) having equal periods to each other and phases offset with respect to each other by 90°, and for performing an arithmetic operation of X=A/(B+α), where α is a constant satisfying B+α≈0, thereby generating a first signal X having approximately linear ramp portions at first 180°-phase-shift intervals;

second arithmetic operation means for receiving the first sinusoidal signal A (=sin θ) and the second sinusoidal signal B (=cos θ), and for performing an arithmetic operation of Y=A/(B+β), where β is a constant satisfying B+β≈0, thereby generating a second signal Y having approximately linear ramp portions at second 180°-phase-shift intervals; and switching means for switching the first and second signals X and Y generated by the respective first and second arithmetic operation means corresponding to the first and second 180°-phase-shift intervals, thereby outputting a sawtooth wave having an amplitude which is proportional to half the period of the first and second sinusoidal signals.

2. A sawtooth generator according to claim 1, wherein the switching means includes:

a timing generator for generating a switching signal for switching the approximately linear ramp portions of the first and second signals X and Y, respectively by detecting at least one of zero-crossing points of the first and second sinusoidal signals; and a switching unit for switching the first and second signals X and Y generated by the first and second arithmetic operation means, respectively, in accordance with the switching signal generated by said timing generator.

3. A signal interpolating apparatus comprising:

first arithmetic operation means for receiving a first sinusoidal signal A (=sin θ) and a second sinusoidal signal B (=cos θ) having equal periods to each other and phases offset with respect to each other by 90°, and for performing an arithmetic operation of X=A/(B+α), where α is a constant satisfying B+α≈0, thereby generating a first signal X having approximately linear ramp portions at first 180°-phase-shift intervals;

second arithmetic operation means for receiving the first sinusoidal signal A (=sin θ) and the second sinusoidal signal B (=cos θ), and for performing an arithmetic operation of Y=A/(B+β), where β is a constant satisfying B+≈0, thereby generating a second signal Y having approximately linear ramp portions at second 180°-phase-shift intervals;

a first A/D converter for receiving the first signal X from the first arithmetic operation means, for converting the first signal X into first digital data, and for outputting the first digital data;

a second A/D converter for receiving the second signal Y from the second arithmetic operation means, for converting the second signal Y into second digital data, and for outputting the second digital data;

switching means for switching the first and second digital data outputs generated by the respective first and second A/D converters, with the digital data outputs corresponding to the first and second 180°-phase-shift intervals, thereby outputting a sawtooth wave having an amplitude which is proportional to half the period of the first and second sinusoidal signals; and a memory for outputting prestored waveform data after receiving the sawtooth wave outputted from the switching means.

4. A signal interpolating apparatus according to claim 3, wherein the switching means includes:

a timing generator for generating a switching signal for switching the first and second digital data outputs by detecting at least one of zero-crossing points of the first and second sinusoidal signals; and a switching unit for switching the first and second digital data outputs generated by the first and second A/D converters, respectively, in accordance with the switching signal generated by said timing generator.

5. A signal interpolating apparatus comprising:

first arithmetic operation means for receiving a first sinusoidal signal A (=sin θ) and a second sinusoidal signal B (=cos θ) having equal periods to each other and phases offset with respect to each other by 90°, and for performing an arithmetic operation of X=A/(B+α), where α is a constant satisfying B+α≈0, thereby generating a first signal X having approximately linear ramp portions at first 180°-phase-shift intervals;

second arithmetic operation means for receiving the first sinusoidal signal A (=sin θ) and the second sinusoidal signal B (=cos θ), and for performing an arithmetic operation of Y=A/(B+β), where β is a constant satisfying B+β≈0, thereby generating a second signal Y having approximately linear ramp portions at second 180°-phase-shift intervals;

switching means for switching the first and second signals X and Y generated by the respective first and second arithmetic operation means corresponding to the first and second 180°-phase-shift intervals, thereby outputting a sawtooth wave having an amplitude which is proportional to half the period of the first and second sinusoidal signals;

an A/D converter for receiving the sawtooth wave from the switching means, converting the sawtooth wave into digital data, and outputting the digital data; and a memory for outputting prestored waveform data in accordance with the digital data outputted from the A/D converter.

6. A signal interpolating apparatus according to claim 5, wherein the switching means includes:

a timing generator for generating a switching signal for switching the approximately linear ramp portions of the first and second signals X and Y respectively by detecting at least one of zero-crossing points of the first and second sinusoidal signals; and a switching unit for switching the first signal X generated by the first arithmetic operation means to/from the second signal Y generated by the second arithmetic operation means in accordance with the switching signal generated by said timing generator.

7. A sawtooth generator comprising:

arithmetic operation means for receiving a first sinusoidal signal A (=sin θ) and a second sinusoidal signal B (=cos θ) having equal periods to each other and phases offset with respect to each other by 90°, said arithmetic operation means including first, second, third and fourth arithmetic operation units for respectively performing arithmetic operations of x1=A (θ)/{B (θ)+γ1},

X2=A (θ+90°)/{B (θ+90°)+γ2},

X3=A (θ+180°)/{B (θ+180°)+γ3}, and

X4=A (θ+270°)/{B (θ+270°)+γ4}, where γ1, γ2, γ3 and γ4 are constants satisfying B (θ) +γ1 ≈0, B (θ+90°)+γ2≈0, B(θ+180°)+γ3≈0 and B (θ+270°)+γ4≈0, respectively, and said first, second, third and fourth arithmetic operation units, respectively outputting first to fourth signals X1, X2, X3 and X4 having two approximately linear ramp portions at first to fourth 90°-phase-shift intervals in the first to fourth arithmetic operation units, respectively; and switching means for switching the first to fourth signals X1, X2, x3 and X4 outputted from the arithmetic means respectively corresponding to the first to fourth 90° -phase-shift intervals, and for outputting a sawtooth wave having an amplitude which is proportional to half the period of the first and second sinusoidal signals.

8. A sawtooth generator according to claim 7, wherein the switching means includes:

a timing generator for generating a switching signal for switching the approximately linear ramp portions of the first to fourth signals X1, X2, X3 and X4, respectively by detecting at least one of zero-crossing points of the first and second sinusoidal signals; and a switching unit for switching the first to fourth signals X1, X2, X3 and X4 generated by the first to fourth arithmetic operation units, respectively, in accordance with the switching signal generated by said timing generator.

* * * * *